United States Patent [19]
Cunningham

[11] Patent Number: 5,359,168
[45] Date of Patent: Oct. 25, 1994

[54] SWITCHING AND CONTROL MECHANISMS

[76] Inventor: Peter R. Cunningham, 32-32 Sir William Drive, East Tamaki, Auckland, New Zealand

[21] Appl. No.: 174,754

[22] Filed: Dec. 29, 1993

Related U.S. Application Data

[63] Continuation of Ser. No. 721,991, Jun. 27, 1991, abandoned.

[30] Foreign Application Priority Data

Jul. 4, 1990 [NZ] New Zealand .................. 234359

[51] Int. Cl.5 .................................................. H01H 85/00
[52] U.S. Cl. .................................. 200/61.08; 200/5 A; 200/300
[58] Field of Search ............... 200/5 A, 61.08, 292, 200/300; 235/487, 489, 492; 340/303, 590; 361/380, 391, 395, 397–400, 412–413

[56] References Cited

U.S. PATENT DOCUMENTS

| | | | |
|---|---|---|---|
| 3,822,369 | 7/1974 | Kunczynski | 200/61.08 |
| 3,974,375 | 8/1976 | Sturm | 250/206 |
| 4,985,808 | 1/1991 | Zernov | 361/406 |

Primary Examiner—A. D. Pellinen
Assistant Examiner—Michael A. Friedhofer
Attorney, Agent, or Firm—Jones & Askew

[57] ABSTRACT

In FIG. 1, an electrical circuit on a circuit board 9 can be controlled by operation of switches 2B, 3B, 4B. These are operated by removing portions of the board 9, effected by the snapping off of respective corresponding cover member portions 2A, 3A and 4A.

When used as a thermal log this control can respectively activate, deactivate and display the thermal data but avoid any tampering.

18 Claims, 3 Drawing Sheets

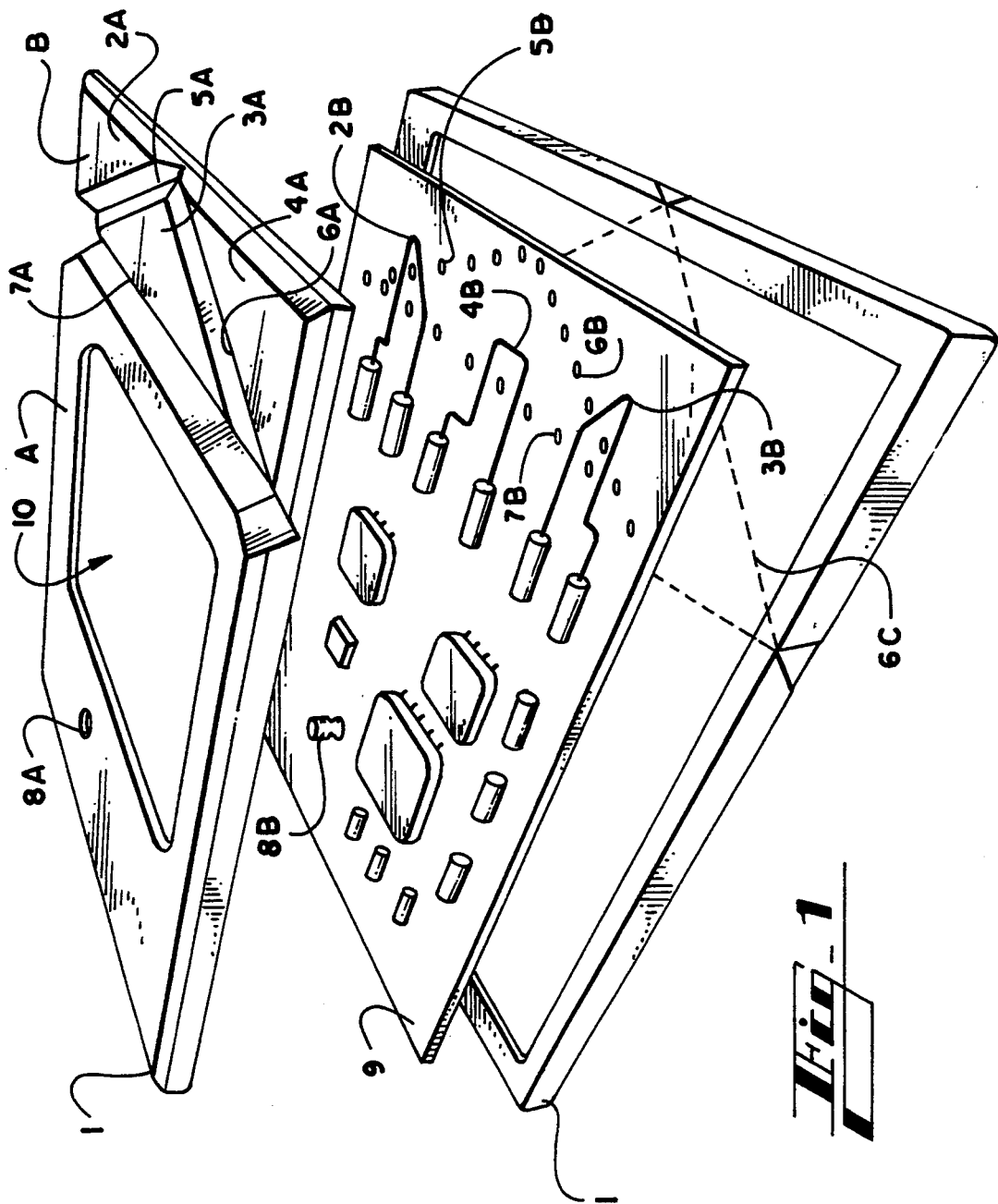

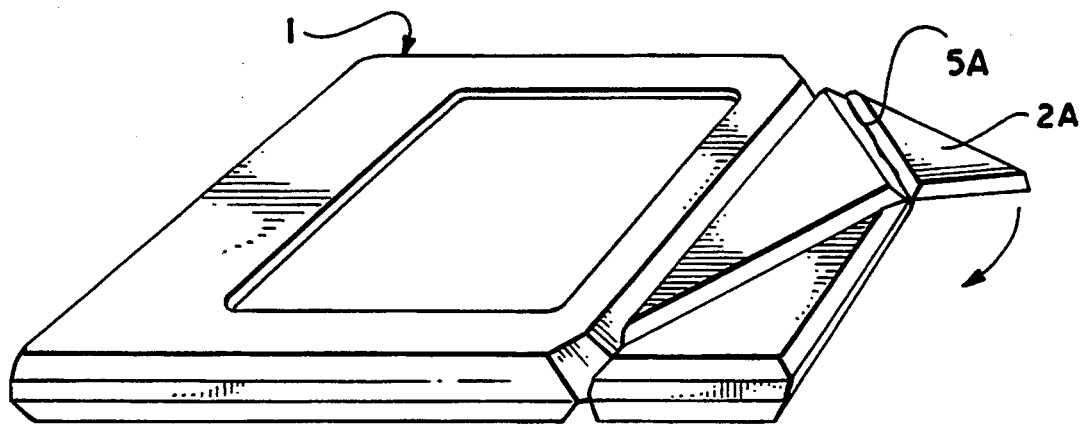
Fig_2A
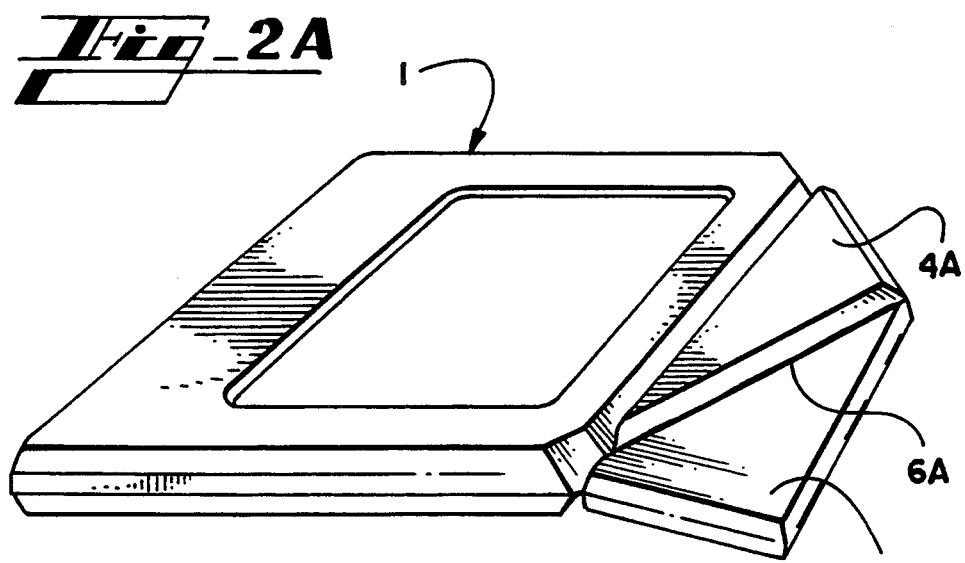
Fig_2B
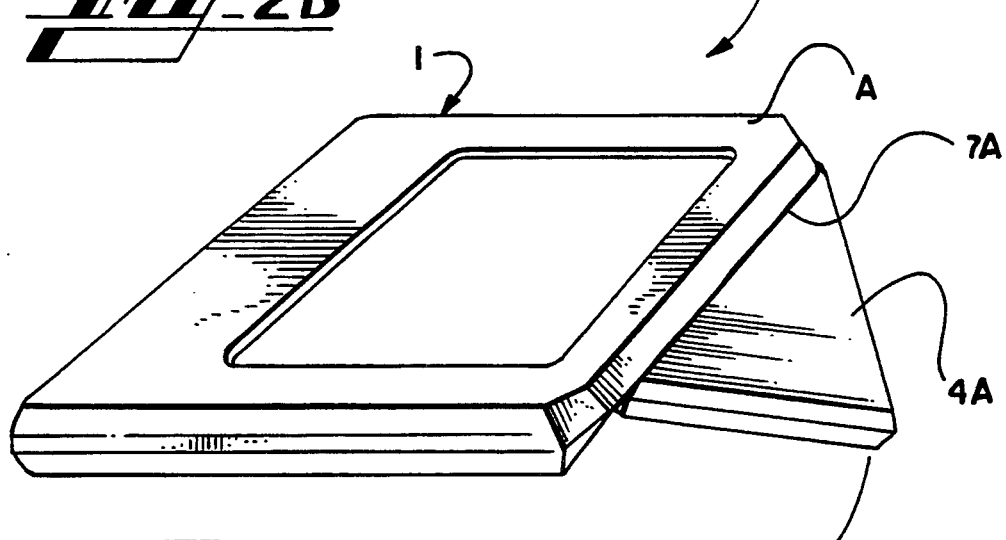
Fig_2C

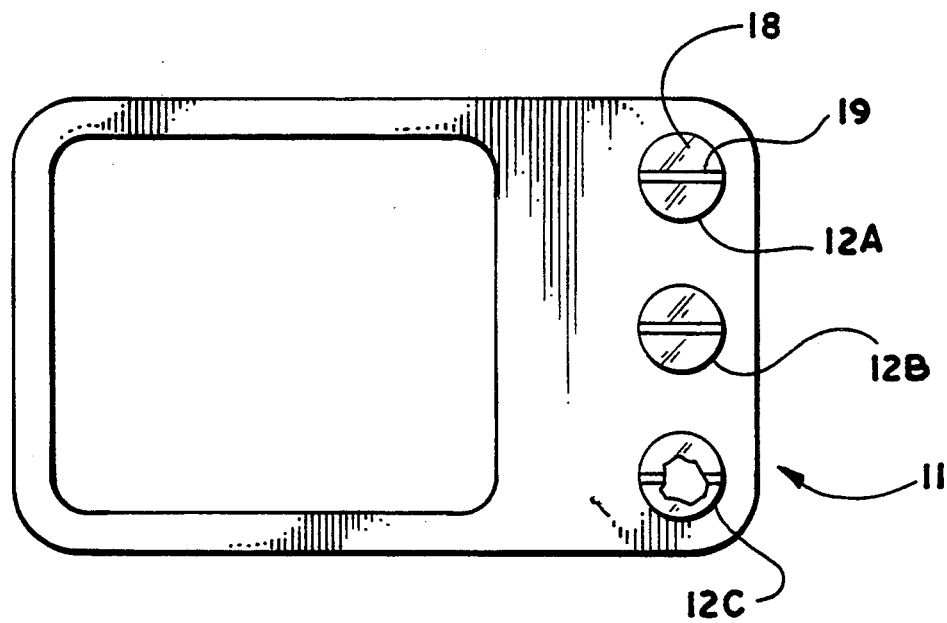
Fig_3
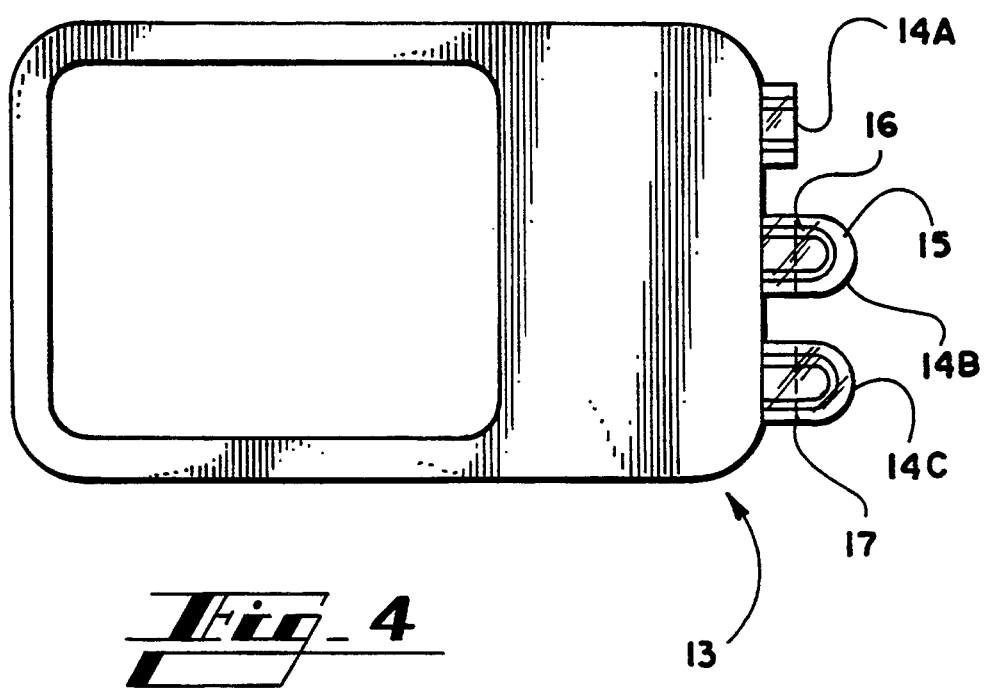
Fig_4

SWITCHING AND CONTROL MECHANISMS

This is a continuation of application Ser. No. 07/721,991, filed Jun. 27, 1991 now abandoned.

BACKGROUND OF THE INVENTION

This invention relates to improvements in and relating to switching mechanisms and in particular switching mechanisms for the control of electrical circuitry, especially that relating to a sensor such as a thermal log.

The term "electrical" is used throughout this specification, including the claims, to encompass any circuit incorporating any type of electrical or electronic components including solid state, discrete and integrated circuit components.

Thermal logs are used for sensing, measuring and recording ambient temperatures over a period of time. They can therefore provide a record of ambient temperatures experienced by perishable goods stored in containers, during a period of transit or storage.

There are, however, a number of difficulties and disadvantages associated with the use of these devices.

Thermal logs are for example susceptible to interference, whether intentional or unintentional. This creates problems with respect to the reliability of the thermal records they provide. Difficulties then arise as to which party, seller, purchaser, shipper or, insurance company, should bear the loss when goods arrive, or are retrieved, in a perished condition after a period of transit or storage.

Further, thermal logs presently available do not indicate if the goods have been subjected to ambient temperatures outside their critical temperature range. Also, if the refrigeration of goods fails for a period during transit or storage and the goods are subsequently re-frozen, it might be some time before the temperature record is known.

SUMMARY OF THE INVENTION

It is an object of this invention to come some way in overcoming the abovementioned problems or at least provide the public with a useful choice. Other objects of this invention will become apparent from the following description.

According to one aspect of this invention, there is provided a switching means for the control of electrical circuitry, comprising one or more circuit portions forming part of said electrical circuitry but physically separable or removable from the remaining portion of said circuitry to control the electrical state of the said circuitry.

According to one further aspect of this invention, there is provided a sensor incorporating electrical circuitry with switching means as immediately above defined.

According to a further aspect of this invention there is provided a method of controlling the electrical state of electrical circuitry said method comprising the provision of one or more circuit portions which form part of said electrical circuitry but which are physically separable or removable therefrom, said method further comprising the separation or removal of said one or more circuit portions to provide a required electrical state.

Other aspects of this invention, which should be considered in all its novel aspects, will become apparent from the following description. The description is by way of example of possible embodiments thereof and in relation particularly to the operation of a sensor such as a thermal log.

BRIEF DESCRIPTION OF THE DRAWINGS

Reference is made to the accompanying drawings, wherein:

FIG. 1: Shows a diagrammatic exploded representation of the body of a thermal log and with its processor board;

FIGS. 2A–2C: Show three representations of the thermal log of FIG. 1 demonstrating steps to achieve states of (i) activation, (ii) deactivation and (iii) retrieval of stored information.

FIG. 3: Shows very diagrammatically a plan view of a body of a thermal log according to a further embodiment of the invention; and FIG. 4: Shows diagrammatically a plan view of a body of a thermal log according to a still further embodiment of the invention.

DESCRIPTION OF THE PREFERRED EMBODIMENTS

Referring to FIGS. 1 and 2 of the accompanying drawings a sensor, in particular a thermal log, is shown with a housing 1 which can wholly enclose a processor board or other circuit support member 9. The processor board 9 may contain integrated circuits, discrete components, and other circuitry as appropriate to provide for the functions of sensing, measuring, recording and subsequent transmission of ambient temperature data. For other sensors the circuitry on board 9 would be changed accordingly.

A suitable power source (not shown) would be provided for the circuitry.

According to a preferred embodiment of this invention, the top and bottom portions of the housing are preferably formed in a mechanically strong plastic and injection moulded in one piece. A complete enclosure of the processor board 9 will as far as possible ensure "tamper-free" operation of the circuitry.

The top of the housing 1 is shown with a panel 10 in which information and instructions for use may be featured.

The upper part of the housing 1 is shown divided into two portions. The larger portion A houses the majority of the circuitry of the processor board 9 while the smaller portion B consists of co-operating "tab" portions 2A, 3A and 4A which house respective circuit switches 2B, 3B and 4B. The "tab" portions 2A, 3A, 4A and the respective circuit switches 2B, 3B and 4B provide an arrangement for the mechanical actuation or deactivation or other control of the functions, to be described, of the circuitry on the board 9.

The lower edges of the "tab" portions 2A, 3A, 4A are shown joined to each other and/or to the larger housing portion A along predetermined lines of weakness 5A, 6A and 7A. These can be provided by grooves in the material, an actual thinning of the material, by perforations or by any other suitable means. In an alternative arrangement, the "tab" portions 2A, 3A, 4A could be releasably coupled together and to the main housing A. Further, complementary predetermined lines of weakness or the like 5B, 6B and 7B are shown provided in the processor board and lines of weakness such as referenced 6C by way of example are shown provided in the bottom part of the housing 1. The lines of weakness 5B, 6B, 7B are indicated by the respective lines of perforations in the board 9 in FIG. 1. These are coextensive with the lines of weakness 5A, 6A, 7A in the outer casing.

In one preferred embodiment of the invention as shown in FIG. 1, the circuit switches 2B, 3B, 4B lie across the lines of weakness 5B, 6B, 7B. Suitably the "switches" 2B, 3B, 4B, which term covering any required control function, may comprise a conductive material circuit path on the substrate of board 9 which is open circuited when the relevant portion of the board 9 is broken off or otherwise detached. Cracking, breaking, snapping or other removal or detachment of a portion of the outer casing 1B along the lines of weakness 5A, 6A, 7A, 6C, etc. mechanically activates or deactivates the respective circuit switches 3B, 4B, 5B. This can then bring about predetermined changes in the electrical activity of the appropriate circuitry of the processor board 9. Of course, there are a very large number of possible arrangements and types of circuit switches available to be employed in the making, breaking, or changing of connections to bring about the above activation or deactivation. These will be readily apparent to those skilled in the electrical/electronic arts.

The invention will now be described with particular reference to the operation of the thermal log device being by way of example of one possible application of the present invention.

The thermal log such as shown in FIGS. 1 and 2 is preferably pocket-sized for convenience of handling. It can therefore can be placed with ease in the appropriate environment where an ambient temperature is to be measured. Activation of the thermal log can occur by applying pressure to one of the "tab" portions such as 2A, as indicated by the arrow, effecting a cracking or fracturing along the line of weakness 5A as shown in FIG. 2(a). A corresponding break will occur across the line of weakness in the bottom housing 1. The circuit switch 2B lying across the corresponding line of weakness 5B in the board 9 is thus activated setting in motion those circuit functions responsible for sensing, measuring and recording of ambient temperatures.

It will be appreciated by those skilled in the electrical and electronic arts that this activation can be achieved satisfactorily in any number of ways.

Preferably there will be some delay before recording functions begin to allow the thermal log to equilibrate with the ambient temperature.

According to a preferred embodiment of the invention, there is provided a display means consisting of a L.E.D. window 8A and a light source 8B. When the thermal log is activated a communication function can be actuated which in turn can produce a predetermined series of light pulses in code visually confirming for the operator that actuation has indeed taken place.

Thus, it can be appreciated that in use, the single step of cracking or fracturing along a predetermined line of weakness followed by a simple confirmation by light pulses that actuation has taken place, provides an actuation procedure which is both simple and efficient.

Further, it will be appreciated that in terms of "tamper-free" operation the breaking or cracking along the predetermined line of weakness does not affect the integrity of the outer casing so that the remaining portions of the body 7 continue to completely enclose and protect the circuitry within.

On the completion of a period of transit or storage the receiver of the goods can bring an end to the functions of the thermal log by employing the same simple procedure as for actuation and as shown in FIG. 2(b). The predetermined line of weakness 6A is broken along its length by applying force in the direction of the arrow to "tab" portion 3A. This mechanically initiates a change in the state of the relevant circuitry by operating the "switch" 3B lying across line of weakness 6B and bringing about deactivation.

According to a preferred embodiment of this invention the above referred to display means 8A, 8B is in communication with the deactivation means and receives a signal which initiates a series of pulses in a predetermined code. This can provide an initial visual indication of whether the particular goods have been subjected to temperatures outside their critical temperature range.

In one embodiment the circuitry on board 9 will determine what the mean temperature in the goods container is. If during the time of transit or storage the temperature departs from that mean temperature then the temperature variation can be indicated by a corresponding number of flashes of the L.E.D. repeated for a short period of time, e.g. sets of two flashes will indicate a 2° C. variation from the mean.

In an alternative embodiment the circuitry on board 9 could include a means for setting the desired "mean" temperature from which variations would be indicated.

It will be appreciated that by the procedures for activation and deactivation previously described in this embodiment of the invention, the thermal log once activated will function and will continue to do so until the appropriate deactivation procedure has taken place. Once the functions of the thermal log have been brought to an end it is not possible for them to be reactivated. This provides another element which adapts the thermal log for "tamper-free" operation.

According to a preferred embodiment of the invention, there is provided a means of retrieving the stored ambient temperature information should there be an initial indication, as described above, that the goods have been subjected to unfavourable temperature conditions.

Suitably the third "tab" portion 4A, which is separable, suitably frangible, with regard to the major portion A of the upper housing 1, can have pressure applied to it as indicated by the arrow in FIG. 2C. This can produce a cracking or fracturing along the predetermined line of weakness 7A, as shown in FIG. 2(c). This operates the "switch" 4B by breaking the board 9 along line of weakness 3B and provides a change in the state of the appropriate circuitry which enables the above information to be retrieved in conjunction with a retrieval means. An indication of temperature variation can then be indicated on the display means 8A by flashes of the L.E.D. 8B. A detailed record of ambient temperatures for the period of transit can then be obtained. It is envisaged that this can be by a hard copy print out from a printer connected to the circuitry of circuit board 9.

The circuitry on board 9 could include provision to delete some data from memory to enable the device to operate over an extended period of time. For example, if activated for more than 7 days, then every second reading could be deleted.

Referring now to FIG. 3 of the accompanying drawings, in a further embodiment to the invention, the thermal log device incorporates a body referenced generally by arrow 11 which, as with the embodiment of FIGS. 1 and 2, will enclose the electronic or electrical circuitry on a suitable board or the like. Portions of the circuitry are exposed through the windows or ports 12A, 12B, 12C provided in the body 11. Part of the electrical circuitry is shown as including a substrate 18 with a conductive portion 19. In the case of window or port 12C, it is seen that this circuitry, and in particular the conductive portion 19, has been broken, scratched away or otherwise damaged by any suitable tool or even an instrument such as a pen or pencil. This provides a break in the electrical circuit so as to achieve the same results as occurred in the embodiment in FIGS. 1 and 2 by the separation of one of the body parts 2A, 3A and 4A. Again, in this instance, the destruction of part of the circuit through port or window 12C can initiate the operation of the thermal log 11. Subsequently, destruction of the circuit track through window or port 12B can then terminate operation of the thermal log 11.

Finally, in this example, destruction of the circuit track through window or port 12A can for example provide for the retrieval of the logged data. The logged data could then, in this embodiment, be displayed as an indication of the temperature variation by flashes on the display means 8A. A full data read out such as a hard copy printout obtained by accessing the electrical circuit by means of a suitable port or terminal (not shown).

In FIG. 4, a further embodiment is shown in which the circuit or processor board (9) is exposed beyond an edge of the body 13 of the thermal log of this embodiment. Each exposed circuit is shown with the substrate 15 and conductive circuit track portion 16 and a severance or weakening line 17 facilitating the snapping off of the end portion, as is illustrated by the exposed circuit portion 14A. Alternatively, possibly in the absence of weakening lines 17, a knife or scissors could just cut through the exposed circuit end.

Once again, the snapping off, breaking, cutting or tearing of the respective exposed circuit ends will provide for the control of the electrical circuit and hence the functioning of the thermal log. Again, severing the circuit for example of a final circuit end 14A may result in a display or read out of the data.

It will be appreciated that because, in the preferred embodiment reactivation is not possible the devices will only be used once and then disposed of. However, these thermal logs will be relatively inexpensive to produce and accordingly can be purchased in large numbers by interested parties, for example shipping companies.

Although a three function control has been described in respect of each of the above embodiments, it is to be appreciated that more or less function controls could be used merely by providing a required number of removable circuit portions.

It is envisaged that an encoding means can be provided with the thermal logs so that details of a particular transit; for example, the shippers name, the port of departure, the destination or the desired temperature range can be encoded therein. Also, each device could have encoded its own particular code for the communication of information given via the L.E.D display window 8A.

In particular, insurance companies which may ultimately bear the loss for any perished goods will find such specially adapted thermal logs useful because their "tamper-free" adaptations will provide them with a greater degree of protection. In the event of a dispute, the detailed examination of the temperature history of a particular transit or storage period could be carried out by an independent third party once an initial indication of unfavourable temperature conditions is received, much in the manner of a "black box" flight recorder.

It will be appreciated that whereas in the abovedescribed embodiment of the invention there is provided a method of controlling the circuitry responsible for recording or tracking temperature experienced over a period of time, the invention could be similarly adapted for the measuring of other conditions experienced over a period of time such as humidity, light, ultra-violet light, radioactivity, or noise levels. Therefore this invention has potentially an extremely large number of possible applications.

The "tamper-free" features described above for this particular embodiment of the invention can be applied to many other common everyday circumstances. For example, the invention could be applied to function as an electrical key to control the actuation of electrical equipment. For example, where electrical equipment is hired out a method of actuation similar to that described above could be employed to record the use of such equipment.

Also, a predetermined code of light pulses could be used as a control means for the actuation of the particular electrical equipment. For example, such an electrical key could be used to actuate a decoder which allows for the reception of particular television channels.

The method of control, and apparatus therefor, described in the above invention provides a circuit which may be mechanically actuated by the cracking or breaking or other separation of an outer casing enclosing circuitry. This separation along predetermined lines of weakness makes available a particularly useful means of recording or tracking measurable conditions over a period of time.

The above method of control may also be particularly useful where the particular recording device should not be interfered with in any way during the period of recording. This is because it allows for the complete enclosure of the circuitry at all times and there is an inability to deactivate the recording functions and subsequently reactuate them.

The method of cracking or breaking or other separation along the one or more predetermined lines of weakness provides a procedure which is both very simple and efficient. Also, as demonstrated by the particular embodiments of the invention described above, the device to be controlled can be pocket-sized for convenience of handling, inexpensive to produce and therefore disposable.

Thus, by this invention there is provided an improved control of electric circuitry particularly, but not exclusively, useful in respect of sensors such as thermal logs.

Where in the aforegoing description reference has been made to specific components or integers having known equivalents, such equivalents are herein incorporated by way of reference. Although this invention has been described by way of example and with reference to possible embodiments thereof, it is to be understood that modifications and improvements may be made thereto without departing from the scope of the invention as defined in the appended claims.

I claim:

1. A switching means for controlling electrical circuitry comprising electrical circuitry including a first circuit portion and at least one second circuit portion, said at least one second circuit portion being physically separable or removable from said first circuit portion to switch the electrical state of said first circuit portion, characterized in that:
- at least said first circuit portion of said electrical circuitry is operative to provide an activated state and a deactivated state;
- said first circuit portion provides means for the detection of loss of said at least one second circuit portion;
- said first circuit portion is operative in response to said loss to switch from an initial one of said states to the opposite state;
- said first circuit portion is provided on a circuit support member;
- a plurality of said second circuit portions are provided on respective portions of said circuit support member, said respective portions each being physically separable from a remaining portion of said support member providing the first circuit portion; and
- a cover member is provided for said circuit support member, said cover member having physically separable portions thereof, each commensurate with one of said respective portions of said circuit support whereby separation of said cover member portion also acts to remove a corresponding portion of a said circuit support member.

2. A switching means as claimed in claim 1 wherein said cover member portions and said circuit support member portions are respectively separable by means of respective lines of weakness therebetween.

3. A switching means for controlling electrical circuitry comprising electrical circuitry including a first circuit portion and at least one second circuit portion, said at least one second circuit portion being physically separable or removable from said first circuit portion to switch the electrical state of said first circuit portion, characterized in that:
- at least said first circuit portion of said electrical circuitry is operative to provide an activated state and a deactivated state;
- said first circuit portion provides means for the detection of loss of said at least one second circuit portion;
- said first circuit portion is operative in response to said loss to switch from an initial one of said states to the opposite state:
- said first circuit portion is provided on a circuit support member; and
- at least three of said second circuit portions are provided on respective portions of said circuit support member which are each physically separable from a remaining portion of said support member providing the first circuit portion, the separation of each respectively initiating: (i) activation of the first circuit portion, (ii) deactivation of the first circuit portion, and (iii) access to data stored in the first circuit portion.

4. A method of controlling the state of electrical circuitry comprising the provision of a first circuit portion having at least a deactivated and an activated state, one or more second circuit portions which form part of said electrical circuitry but which are physically separable or removable therefrom, said first circuit portion being operative to detect the loss of said one or more second circuit portions and thereby switch to an opposite state; said method comprising the steps of
- physical separation or removal of said one or more second circuit portions from said first circuit portion to provide a required electrical state of said first circuit portion;
- providing said electrical circuitry on a circuit support member and further providing said first circuit portion and said one or more second circuit portions on respective portions of said circuit support member which can be physically detached one from the other;
- providing a cover member for said electrical circuitry and leaving said one or more second circuit portions exposed relative to said cover member; and
- physically removing or detaching a respective said exposed one or more second support portion from the remaining first circuit portion of said electrical circuitry.

5. A method as claimed in claim 4 and including the further step of exposing said one or more second circuit portions by means of apertures provided in said cover member.

6. A method as claimed in claim 4 wherein the exposing of said one or more second circuit portions is provided by the extension of said one or more second circuit portions beyond an edge of said cover member.

7. A switching means for controlling electrical circuitry comprising electrical circuitry including a first circuit portion and at least one second circuit portion, said at least one second circuit portion being physically separable or removable from said first circuit portion to switch the electrical state of said first circuit portion, characterized in that:
- at least said first circuit portion of said electrical circuitry is operative to provide an activated state and a deactivated state;
- said first circuit portion provides means for the detection of loss of said at least one second circuit portion;
- said first circuit portion is operative in response to said loss to switch from an initial one of said states to the opposite state:
- a cover member is provided for said electrical circuitry; and
- said at least one second circuit portion is exposed relative to said cover member.

8. A switching means as claimed in claim 7 wherein said at least one second circuit is exposed through corresponding respective apertures provided in said cover member enabling said one more second circuit portions to be physically removed or severed.

9. A switching means as claimed in claim 7 wherein said at least one second circuit portion is exposed relative to said cover member by the corresponding second circuit portion extending outwardly from said cover member, and wherein the corresponding outward extension is able to be physically separated from a remaining portion of said circuitry.

10. A switching means as claimed in claim 9 wherein the corresponding outward extension includes a line of weakness to facilitate its physical separation.

11. A switching means for controlling electrical circuitry comprising electrical circuitry including a first circuit portion and at least one second circuit portion, said at least one second circuit portion being physically separable or removable from said first circuit portion to switch the electrical state of said first circuit portion, characterized in that:
- at least said first circuit portion of said electrical circuitry is operative to provide an activated state and a deactivated state;

said first circuit portion provides means for the detection of loss of said at least one second circuit portion;

said first circuit portion is operative in response to said loss to switch from an initial one of said states to the opposite state;

said first circuit portion is activated into an electrical state to record ambient temperature in an environment in which the apparatus is situated and to provide verification of said activation, in response to said physical separation or removal of at least one of said second circuit portions, whereby the switching means provides a thermal log.

12. A switching apparatus for controlling electrical circuitry, the switching apparatus including a first circuit portion and at least one second circuit portion physically separable or removable from said first circuit portion to switch the electrical state of said first circuit portion, the switching apparatus comprising:

at least the first circuit portion of the electrical circuitry being operative to provide an activated state and a deactivated state;

said first circuit portion is provided on a circuit support member;

at least one second circuit portion physically detachable from the first circuit portion;

a cover disposed on at least the first circuit portion to prevent tampering with the covered circuit portion;

said first circuit portion provides means for the detection of loss of said at least one second circuit portion;

and said first circuit portion is operative in response to said loss to switch from an initial one of said states to the opposite state.

13. A switching means as claimed in claim 12 wherein said cover has at least one physically separable portion commensurate with said second circuit portion, whereby separation of a said cover portion also removes the second circuit portion thereon.

14. A switching means as claimed in claim 13 wherein said apparatus includes at least two second circuit portions;

said cover has physically separable portions each commensurate with one of said second portions of said circuit, whereby separation of a said cover portion also removes a corresponding second circuit portion thereon.

15. A switching means as claimed in claim 12 wherein said apparatus includes a second circuit support member portion physically separable or removable from the remainder of said circuit support member whereby separation of said second circuit support member portion also removes the second circuit portion thereon.

16. A switching means as claimed in claim 15 wherein said apparatus includes at least two second circuit portions each having a corresponding second circuit support member portion physically separable from the remainder of said circuit support member and from each other whereby separation of each said second circuit support member portion also removes a corresponding second circuit portion thereon.

17. A switching means as claimed in claim 12 wherein said apparatus includes a cover portion having at least one physically separable portion commensurate with said second circuit portion and wherein said circuit support member has at least one physically separable portion commensurate with said second circuit portion and whereby separation of said cover portion also removes a corresponding portion of said circuit support member and the second circuit portion thereon.

18. A switching means as claimed in claim 17 wherein said cover portions and said circuit support member portions are respectively separable by means of respective lines of weakness therebetween.

* * * * *